(12) United States Patent
Gutierrez Ruiz et al.

(10) Patent No.: US 9,243,476 B2
(45) Date of Patent: Jan. 26, 2016

(54) SYSTEM AND METHOD FOR SIMULATING OILFIELD OPERATIONS

(75) Inventors: Veronica Gutierrez Ruiz, Tab. (MX); Juan Jose Quijano Velasco, Rio de Janeiro (BR); Nicolas Americo Gomez Bustamante, Campeche (MX)

(73) Assignee: Schlumberger Technology Corporation, Sugar Land, TX (US)

( * ) Notice: Subject to any disclaimer, the term of this patent is extended or adjusted under 35 U.S.C. 154(b) by 713 days.

(21) Appl. No.: 12/782,984

(22) Filed: May 19, 2010

(65) Prior Publication Data

US 2011/0288842 A1    Nov. 24, 2011

(51) Int. Cl.
*G06G 7/48* (2006.01)
*E21B 43/00* (2006.01)
*G06F 17/50* (2006.01)
*E21B 49/00* (2006.01)

(52) U.S. Cl.
CPC ............ *E21B 43/00* (2013.01); *G06F 17/5009* (2013.01); *E21B 49/00* (2013.01)

(58) Field of Classification Search
CPC ...... E21B 43/00; E21B 49/00; G06F 17/5009
USPC .......................................................... 703/10
See application file for complete search history.

(56) References Cited

U.S. PATENT DOCUMENTS

| | | | |
|---|---|---|---|
| 5,992,519 A | 11/1999 | Ramakrishnan et al. | |
| 6,313,837 B1 | 11/2001 | Assa et al. | |
| 6,980,940 B1 | 12/2005 | Gurpinar et al. | |
| 7,093,206 B2* | 8/2006 | Anand et al. | 716/115 |
| 7,248,259 B2 | 7/2007 | Fremming | |
| 7,689,397 B2* | 3/2010 | Ghorayeb et al. | 703/10 |
| 2003/0203342 A1* | 10/2003 | Bowers | 434/118 |
| 2003/0216897 A1 | 11/2003 | Endres et al. | |
| 2004/0220846 A1 | 11/2004 | Cullick et al. | |
| 2004/0220893 A1* | 11/2004 | Spivack et al. | 706/46 |
| 2005/0149307 A1 | 7/2005 | Gurpinar et al. | |
| 2005/0197807 A1* | 9/2005 | Nelson et al. | 703/1 |
| 2006/0197759 A1 | 9/2006 | Fremming | |
| 2007/0112547 A1* | 5/2007 | Ghorayeb et al. | 703/10 |
| 2007/0271077 A1* | 11/2007 | Kosmala et al. | 703/5 |
| 2007/0299643 A1* | 12/2007 | Guyaguler et al. | 703/10 |
| 2008/0077377 A1* | 3/2008 | Roesner et al. | 703/13 |

(Continued)

FOREIGN PATENT DOCUMENTS

| | | |
|---|---|---|
| WO | 99/64896 A1 | 12/1999 |
| WO | 2004/049216 A1 | 6/2004 |

OTHER PUBLICATIONS

Trick, M.D., A Different Approach to Coupling a Reservoir Simulator with a Surface Facilities Model, 1998 SPE Gas Technology Symposium, Mar. 15-18, 1998, Calgary, Alberta, Canada.*

(Continued)

*Primary Examiner* — David Silver
(74) *Attorney, Agent, or Firm* — Alec J. McGinn

(57) ABSTRACT

A method is provided for simulating oilfield operations. The method may include receiving two or more reservoir models to be simulated and receiving two or more surface models to be simulated. The method may further include automatically generating a communication file to couple the two or more reservoir models with the two or more surface models. Additionally, the method may include simulating the coupled reservoir models and surface models.

16 Claims, 6 Drawing Sheets

(56) References Cited

U.S. PATENT DOCUMENTS

| | | | |
|---|---|---|---|
| 2011/0093864 A1* | 4/2011 | Wood et al. | 719/313 |
| 2012/0006560 A1* | 1/2012 | Calvert et al. | 166/369 |

OTHER PUBLICATIONS

Vignati et al, "Innovative Implementation of Compositional Delumping in Integrated Asset Modeling", Aug. 2009 SPE Reservoir Evaluation & Engineering, 12 pages.*

Venkataraman, "Application of PIPESIM-FPT Link to Eclipse 100 to Evaluate Field Development Options", OTC 11966, 9 pages.*

Landmark, "OpenWorks Software," Feb. 2008, 4 pages, [retrieved on May 19, 2010 from the internet http://www.halliburton.com/public/landmark/contents/Data_Sheets/web/H05283.pdf].

Landmark, "SeisWorks 3D," Mar. 2008, 4 pages, [pdf online, retrieved on May 19, 2010 from the internet http://www.halliburton.com/public/landmark/contents/Data_Sheets/web/H04865.pdf].

Landmark, "SeisWorks 2D Software," Mar. 2008, 4 pages, [pdf online, retrieved on May 19, 2010 from the internet http://www.halliburton.com/public/landmark/contents/Data_Sheets/web/H04973.pdf].

Landmark, "StratWorks," Mar. 2008, 4 pages, [pdf online, retrieved on May 19, 2010 from the Internet http://www.halliburton.com/public/landmark/contents/Data_Sheets/web/H04870.pdf].

Landmark, "GeoProbe," 4 pages, [web site page, retrieved on May 19, 2010 from the Internet http://www.halliburton.com/ps/PrintPreview.aspx?pageid=8428,navid=2208prodid=MSE:1062600092683168].

Landmark, "ARIES Economics System," 2009, 4 pages, [pdf online, retrieved on May 19, 2010 from the internet http://www.halliburton.com/public/geographix/contents/Data_Sheets/web/H04979.pdf].

Paradigm, "Paradigm VoxelGeo," 2010, 1 page, [website page, retrieved on May 19, 2010 from the Internet http://www.pdgm.com/products/interpretation-modeling/voxelgeo.aspx].

Paradigm, "Paradigm Geolog," 2010, 1 page, [website page, retrieved on May 19, 2010 from the internet http://www.pdgm.com/products/geolog.aspx].

Paradigm, "Paradigm Stratimagic," 2010, 1 page, [website page, retrieved on May 19, 2010 from the Internet http://www.pdgm.com/products/interpretation-modeling/stratimagic.aspx].

Roxar, "RMS2009," Feb. 2009, 2 pages, [pdf online, retrieved on May 19, 2010 from the Internet http://www.roxar.com/getfile.php/Files/Product%20Datasheets/Software/RMS%20Suite/RMS_2009_A4_final.pdf].

Schlumberger, "Petrel Seismic to Simulation Software," 2009, 2 pages, [website page, retrieved on May 19, 2010 from the internet http://www.slb.com/services/software/geo/petrel.aspx].

Examination Report to Mexican Patent Application No. MX/a/2011/003545 dated Jun. 25, 2013 (7 pages).

Anonymous, "JewelSuite 2009 Enhancements Overview," Baker Hughes, 2009: pp. 1-14.

Anonymous, "JewelSuite Integrated Reservoir Modeling," Baker Hughes, 2009 (retrieved May 19, 2010): pp. 1-12 (including transcription).

* cited by examiner

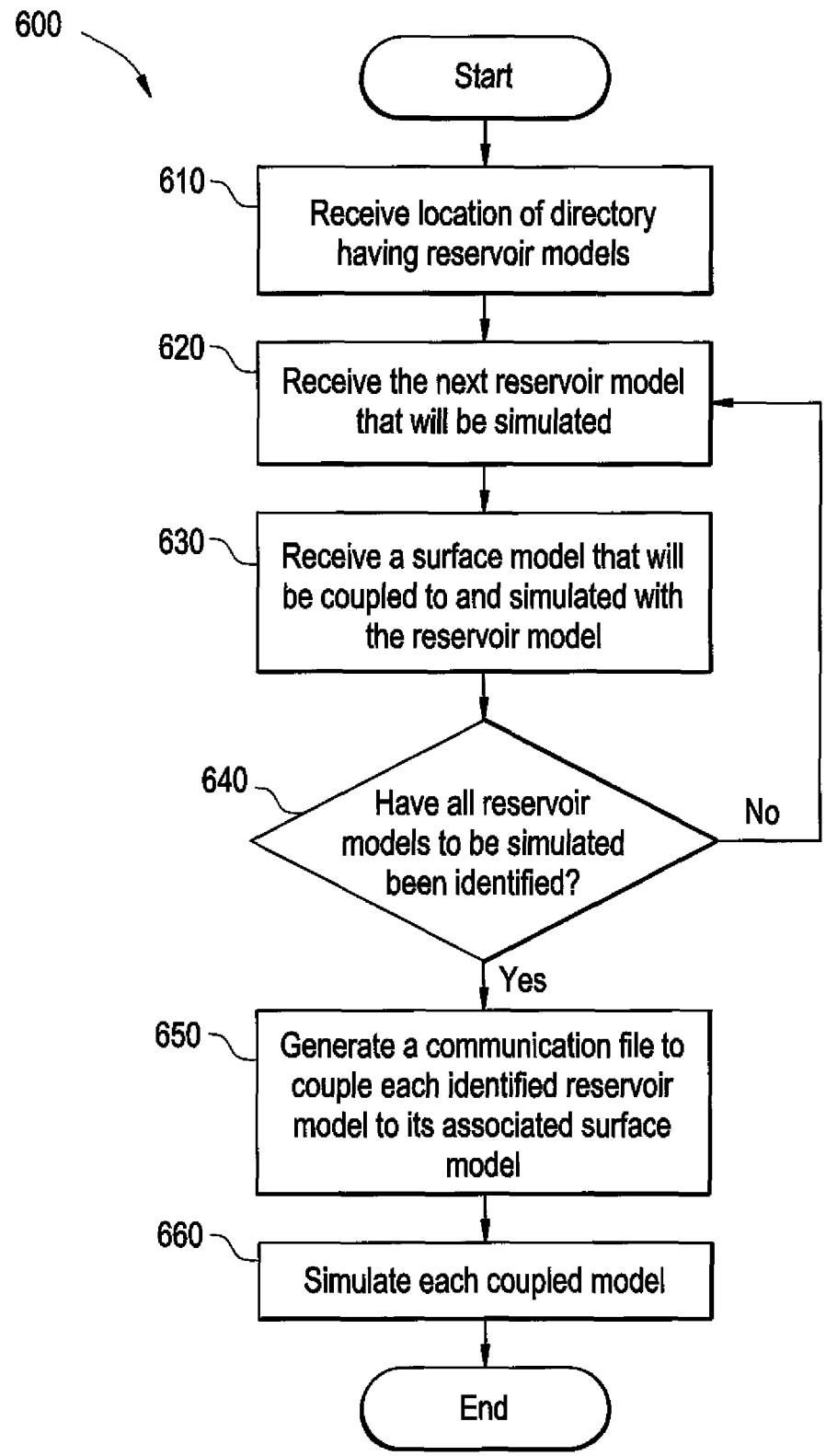

SYSTEM AND METHOD FOR SIMULATING OILFIELD OPERATIONS

BACKGROUND

1. Field of the Invention

Implementations of various techniques described herein generally relate to techniques for performing oilfield operations on subterranean formations having reservoirs therein, and more particularly, to techniques for simulating oilfield operations.

2. Description of the Related Art

The following descriptions and examples do not constitute an admission as prior art by virtue of their inclusion within this section.

Oilfield operations, such as surveying, drilling, wireline testing, completions, production, planning and oilfield analysis, are typically performed to locate and gather valuable downhole fluids. Various aspects of the oilfield and its related operations are shown in FIGS. 1A-1D. As shown in FIG. 1A, surveys are often performed using acquisition methodologies, such as seismic scanners or surveyors, to generate maps of underground formations. These formations are often analyzed to determine the presence of subterranean assets, such as valuable fluids or minerals. This information is used to assess the underground formations and locate the formations containing the desired subterranean assets. This information may also be used to determine whether the formations have characteristics suitable for storing fluids. Data collected from the acquisition methodologies may be evaluated and analyzed to determine whether such valuable assets are present, and if they are reasonably accessible.

As shown in FIGS. 1B-1D, one or more wellsites may be positioned along the underground formations to gather valuable fluids from the subterranean reservoirs. The wellsites are provided with tools capable of locating and removing hydrocarbons, such as oil or gas, from the subterranean reservoirs. As shown in FIG. 1B, drilling tools are typically deployed from the oil and gas rigs and advanced into the earth along a path to locate reservoirs containing the valuable downhole assets. Fluid, such as drilling mud or other drilling fluids, is pumped down the wellbore through the drilling tool and out the drilling bit. The drilling fluid flows through the annulus between the drilling tool and the wellbore and out the surface, carrying away earth loosened during drilling. The drilling fluids return the earth to the surface and seal the wall of the wellbore to prevent fluid in the surrounding earth from entering the wellbore and causing a 'blow out.'

During the drilling operation, the drilling tool may perform downhole measurements to investigate downhole conditions. The drilling tool may be used to take core samples of the subsurface formations. In some cases, as shown in FIG. 1C, the drilling tool is removed and a wireline tool is deployed into the wellbore to perform additional downhole testing, such as logging or sampling. Steel casing may be run into the well to a desired depth and cemented into place along the wellbore wall. Drilling may be continued until the desired total depth is reached.

After the drilling operation is complete, the well may then be prepared for production. As shown in FIG. 1D, wellbore completions equipment is deployed into the wellbore to complete the well in preparation for the production of fluid through the wellbore. Fluid is then allowed to flow from downhole reservoirs into the wellbore and then the surface. Production facilities are positioned at surface locations to collect the hydrocarbons from the wellsite(s). Fluid drawn from the subterranean reservoir(s) passes to the production facilities via transport mechanisms, such as tubing. Various types of equipment may be positioned about the oilfield to monitor oilfield parameters, to manipulate the oilfield operations, and/or to separate and direct fluids from the wells. Surface equipment and completion equipment may also be used to inject fluids into reservoirs, either for storage or at strategic points to enhance production of the reservoir.

During the oilfield operations, data is typically collected for analysis and/or monitoring of the oilfield operations. Such data may include, for example, subterranean formation, equipment, historical and/or other data. Data concerning the subterranean formation is collected using a variety of sources. Such formation data may be static or dynamic. Static data may relate to, for example, formation structure and geological stratigraphy that define geological structures of the subterranean formation. Dynamic data may relate to, for example, well production data. Such static and/or dynamic data may be collected to learn more about the formations and the valuable assets contained therein.

Sources used to collect static data may be seismic tools, such as a seismic truck that sends compression waves into the earth as shown in FIG. 1A. Signals from these waves are processed and interpreted to characterize changes in the anisotropic and/or elastic properties, such as velocity and density, of the geological formation at various depths. This information may be used to generate basic structural maps of the subterranean formation. Other static measurements may be gathered using downhole measurements, such as core sampling and well logging techniques. Core samples are used to take physical specimens of the formation at various depths as shown in FIG. 1B. Well logging involves deployment of a downhole tool into the wellbore to collect various downhole measurements, such as density, resistivity, etc., at various depths. Such well logging may be performed using, for example, the drilling tool of FIG. 1B and/or the wireline tool of FIG. 1C. Once the well is formed and completed, fluid flows to the surface using production tubing and other completion equipment as shown in FIG. 1D. As fluid passes to the surface, various dynamic measurements, such as fluid flow rates, pressure and composition may be monitored. These parameters may be used to determine various characteristics of the subterranean formation.

Sensors may be positioned about the oilfield to collect data relating to various oilfield operations. For example, sensors in the drilling equipment may monitor drilling conditions, sensors in the wellbore may monitor fluid composition, sensors located along the flow path may monitor flow rates and sensors at the processing facility may monitor fluids collected. Other sensors may be provided to monitor downhole, surface, equipment or other conditions. Such conditions may relate to the type of equipment at the wellsite, the operating setup, formation parameters or other variables of the oilfield. The monitored data is often used to make decisions at various locations of the oilfield at various times. Data collected by these sensors may be further analyzed and processed. Data may be collected and used for current or future operations. When used for future operations at the same or other locations, such data may sometimes be referred to as historical data. The data may be used to predict downhole conditions, and make decisions concerning oilfield operations. Such decisions may involve well planning, well targeting, well completions, operating levels, production rates and other operations and/or operating parameters. Often this information is used to determine when to drill new wells, re-complete existing wells or alter wellbore production. Oilfield conditions, such as geological, geophysical, and reservoir engineering characteristics, may have an impact on oilfield operations, such as risk analysis, economic valuation, and mechanical considerations for the production of subsurface reservoirs. Data from one or more wellbores may be analyzed to plan or predict various outcomes at a given wellbore. In some cases, the data from neighboring wellbores, or wellbores with similar conditions or equipment, may be used to predict how a well will perform. There are usually a large number of variables and large quantities of data to consider in analyzing oilfield operations. It is, therefore, often useful to model the behavior of the oilfield operation to determine a desired course of action. During the ongoing operations, the operating parameters may need adjustment as oilfield conditions change and new information is received.

In modeling a reservoir, seismic measurements and measurements at the well bore level, both static and dynamic, may be taken. It should be noted that while such measurements may be useful in modeling a reservoir, they may not be sufficient to fully characterize the subsurface reservoir. Additionally, less data about the reservoir may be available at points in the reservoir that are further away from the wellbores. Therefore, certain assumptions may be made about these areas, thereby creating certain degrees of variability in modeling the reservoir.

As such, various techniques, more fully described below, have been developed to take into account these assumptions and create multiple realizations of the reservoir. To this end, the realizations may be constructed such that each realization may have approximately the same probability of occurring. Furthermore, each realization may be a product of the different combinations of measurement data and assumptions used to model the reservoir.

Techniques have been developed to model various portions of oilfield operations such as geological formations, downhole reservoir, wellbores, and surface facilities. Examples of these techniques are shown in Patent/Application Nos. U.S. Pat. No. 5,992,519, WO2004049216, WO1999/064896, U.S. Pat. No. 6,313,837, US2003/0216897, U.S. Pat. No. 7,248,259, US2005/0149307 and US2006/0197759. Existing modeling techniques have typically been used to analyze only specific portions of oilfield operations. More recently, attempts have been made to use more than one model in analyzing certain oilfield operations. See, for example, Patent/Application Nos. U.S. Pat. No. 6,980,940, WO04049216, US2004/0220846 and US2007/0112547. Additionally, techniques for modeling certain aspects of an oilfield have been developed, such as OPENWORKS™ with, e.g., SEISWORKS™, STRATWORKS™, GEOPROBE™ or ARIES™ by LANDMARK™ (see www.lgc.com); VOXELGEO™, GEOLOG™ and STRATIMAGIC™ by PARADIGM™ (see www.paradigmgeo.com); JEWELSUITE™ by JOA™ (see www.jewelsuite.com); RMS™ products by ROXAR™ (see www.roxar.com), and PETREL™ by SCHLUMBERGER™ (see www.slb.com/content/services/software/index.asp).

Typically, for an entire production scenario, multiple realizations of a reservoir model may be created to take into account the various assumptions made about the reservoir as describe above. Furthermore, multiple surface models modeling the surface facilities used to extract or otherwise manipulate the fluids in the reservoir may also be created. The reservoir models and the surface models may then be coupled to form a coupled model, and a simulation may then be executed on the coupled model. However, current techniques require that each model must be manually coupled with one another and manually sent to a remote computing center to be simulated. In the context of hundreds, and even thousands, of coupled models, manually performing these tasks can be very time-intensive and burdensome.

SUMMARY

Various techniques described herein are directed to a method for simulating oilfield operations. In one implementation, the method may include receiving two or more reservoir models to be simulated and receiving two or more surface models to be simulated. The method may further include automatically generating a communication file to couple the two or more reservoir models with the two or more surface models. Additionally, the method may include simulating the coupled reservoir models and surface models.

Various techniques described herein are also directed to a simulation system. In one implementation, the simulation system may include at least one processor and a memory. To this end, the memory may include program instructions that may be executed by the processor, thereby causing the processor to receive two or more reservoir models to be simulated. Furthermore, the instructions may cause the processor to receive two or more surface models to be simulated and automatically generate a communication file to couple the reservoir models with the surface models. Moreover, the instructions may cause the processor to automatically simulate the coupled reservoir models and surface models.

Various techniques described herein are further directed to a computer readable medium. In one implementation, the computer readable medium may have computer executable instructions stored thereon, and when such instructions are executed by a computer, the instructions may cause the computer to receive two or more reservoir models to be simulated. The instructions may further cause the computer to receive two or more surface models to be simulated and automatically generate a communication file to couple the reservoir models with the surface models. Additionally, the instructions may cause the computer to automatically simulate the coupled reservoir models and surface models.

The above referenced summary section is provided to introduce a selection of concepts in simplified form that are further described below in the detailed description section. The summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The accompanying drawings, described below, illustrate typical embodiments of the invention and are not to be considered limiting of the scope of the invention, for the invention may admit to other equally effective embodiments. The figures are not necessarily to scale, and certain features and certain views of the figures may be shown exaggerated in scale or in schematic in the interest of clarity and conciseness.

FIG. 6 illustrates a flow diagram of a method for automatically coupling reservoir models with surface models in which the various technologies described herein may be incorporated and practiced.

DETAILED DESCRIPTION

The discussion below is directed to certain specific implementations. It is to be understood that the discussion below is only for the purpose of enabling a person with ordinary skill in the art to make and use any subject matter defined now or later by the patent "claims" found in any issued patent herein.

Various techniques described herein are directed to simulating oilfield operations. The following paragraph provides a brief description or summary of various techniques described herein.

In one implementation, a plug-in application may be used to receive the location of multiple reservoir models. The plug-in application may then determine which reservoir models are to be simulated. Additionally, the plug-in application may receive multiple surface models, some of which to be coupled to the reservoir models. The plug-in application may then generate a communication file for the surface models to be coupled to the reservoir models. The plug-in application may then send the coupled models to a computing center to be simulated.

Various techniques described herein are implemented with reference to an oil field operation. As such, before describing implementations of these techniques, it may be useful to describe a suitable oil field operation that may benefit from the various techniques described herein.

Figure 1A:
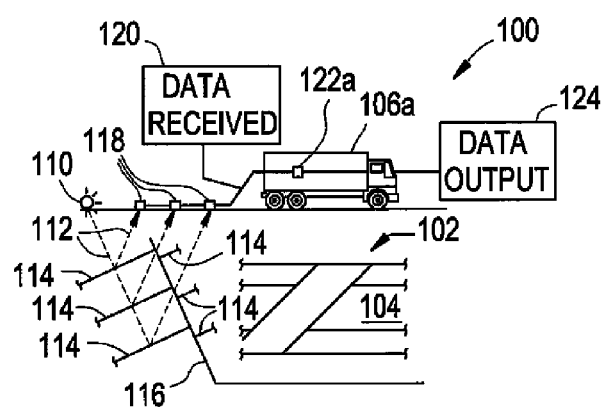
FIG. 1A depicts a simplified, schematic view of an oilfield operation having subterranean formations containing reservoirs and a survey operation being performed by a seismic truck.

FIGS. 1A-1D depict simplified, representative, schematic views of an oilfield 100 having subterranean formation 102 containing reservoir 104 therein and depicting various oilfield operations being performed on the oilfield. FIG. 1A depicts a survey operation being performed by a survey tool, such as seismic truck 106a, to measure properties of the subterranean formation. The survey operation is a seismic survey operation for producing sound vibrations. In FIG. 1A, one such sound vibration 112 generated by a source 110 reflects off a plurality of horizons 114 in an earth formation 116. The sound vibration(s) 112 is (are) received in by sensors, such as geophone-receivers 118, situated on the earth's surface, and the geophones 118 produce electrical output signals, referred to as data received 120 in FIG. 1A.

In response to the received sound vibration(s) 112 representative of different parameters (such as amplitude and/or frequency) of the sound vibration(s) 112, the geophones 118 produce electrical output signals containing data concerning the subterranean formation. The data received 120 is provided as input data to a computer 122a of the seismic truck 106a, and responsive to the input data, the computer 122a generates a seismic data output 124. The seismic data output may be stored, transmitted or further processed as desired, for example by data reduction.

Figure 1B:
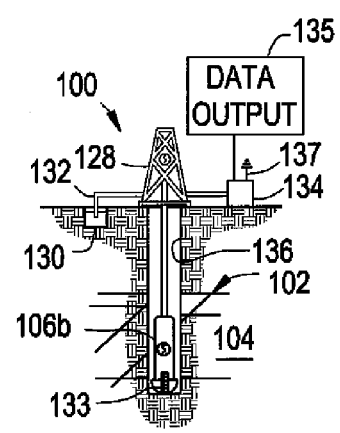
FIG. 1B depicts a simplified, schematic view of an oilfield operation having subterranean formations containing reservoirs and a drilling operation being performed by a drilling tool suspended by a rig and advanced into the subterranean formations.

FIG. 1B depicts a drilling operation being performed by drilling tools 106b suspended by a rig 128 and advanced into the subterranean formations 102 to form a wellbore 136. A mud pit 130 is used to draw drilling mud into the drilling tools via flow line 132 for circulating drilling mud through the drilling tools, up the wellbore 136 and back to the surface. The drilling mud is usually filtered and returned to the mud pit. A circulating system may be used for storing, controlling or filtering the flowing drilling muds. The drilling tools are advanced into the subterranean formations to reach reservoir 104. Each well may target one or more reservoirs. The drilling tools are preferably adapted for measuring downhole properties using logging while drilling tools. The logging while drilling tool may also be adapted for taking a core sample 133 as shown, or removed so that a core sample may be taken using another tool.

A surface unit 134 is used to communicate with the drilling tools and/or offsite operations. The surface unit is capable of communicating with the drilling tools to send commands to the drilling tools, and to receive data therefrom. The surface unit is preferably provided with computer facilities for receiving, storing, processing, and/or analyzing data from the oilfield. The surface unit collects data generated during the drilling operation and produces data output 135 which may be stored or transmitted. Computer facilities, such as those of the surface unit, may be positioned at various locations about the oilfield and/or at remote locations.

Sensors S, such as gauges, may be positioned about the oilfield to collect data relating to various oilfield operations as described previously. As shown, a sensor S may be positioned in one or more locations in the drilling tools and/or at the rig to measure drilling parameters, such as weight on bit, torque on bit, pressures, temperatures, flow rates, compositions, rotary speed and/or other parameters of the oilfield operation. Sensors may also be positioned in one or more locations in the circulating system.

The data gathered by the sensors may be collected by the surface unit and/or other data collection sources for analysis or other processing. The data collected by the sensors may be used alone or in combination with other data. The data may be collected in one or more databases and/or transmitted on or offsite. All or select portions of the data may be selectively used for analyzing and/or predicting oilfield operations of the current wellbore and/or other wellbores. The data may be historical data, real time data or combinations thereof. The real time data may be used in real time, or stored for later use. The data may also be combined with historical data or other inputs for further analysis. The data may be stored in separate databases, or combined into a single database.

The collected data may be used to perform analysis, such as modeling operations. For example, the seismic data output may be used to perform geological, geophysical, and/or reservoir engineering. The reservoir, wellbore, surface and/or process data may be used to perform reservoir, wellbore, geological, geophysical or other simulations. The data outputs from the oilfield operation may be generated directly from the sensors, or after some preprocessing or modeling. These data outputs may act as inputs for further analysis.

The data may be collected and stored at the surface unit 134. One or more surface units may be located at the oilfield, or connected remotely thereto. The surface unit 134 may be a single unit, or a complex network of units used to perform the necessary data management functions throughout the oilfield. The surface unit 134 may be a manual or automatic system. The surface unit 134 may be operated and/or adjusted by a user.

The surface unit 134 may be provided with a transceiver 137 to allow communications between the surface unit 134 and various portions of the oilfield or other locations. The surface unit 134 may also be provided with or functionally connected to one or more controllers for actuating mechanisms at the oilfield. The surface unit 134 may then send command signals to the oilfield in response to data received. The surface unit 134 may receive commands via the transceiver or may itself execute commands to the controller. A processor may be provided to analyze the data (locally or remotely), make the decisions and/or actuate the controller. In this manner, the oilfield may be selectively adjusted based on the data collected. This technique may be used to optimize portions of the oilfield operation, such as controlling drilling, weight on bit, pump rates or other parameters. These adjustments may be made automatically based on computer protocol, and/or manually by an operator. In some cases, well plans may be adjusted to select optimum operating conditions, or to avoid problems.

Figure 1C:
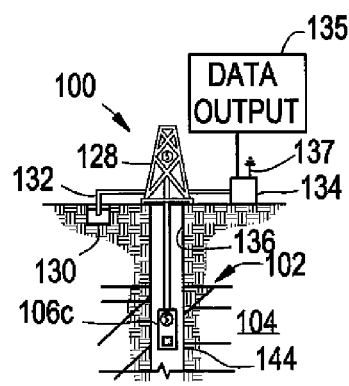
FIG. 1C depicts a simplified, schematic view of an oilfield operation having subterranean formations containing reservoirs and a wireline operation being performed by a wireline tool suspended in a wellbore by a rig.

FIG. 1C depicts a wireline operation being performed by a wireline tool 106c suspended by the rig 128 and into the wellbore 136 of FIG. 1B. The wireline tool 106c is preferably adapted for deployment into a wellbore for generating well logs, performing downhole tests and/or collecting samples. The wireline tool 106c may be used to provide another method and apparatus for performing a seismic survey operation. The wireline tool 106c of FIG. 1C may, for example, have an explosive, radioactive, electrical, or acoustic energy source 144 that sends and/or receives electrical signals to the surrounding subterranean formations 102 and fluids therein.

The wireline tool 106c may be operatively connected to, for example, the geophones 118 and the computer 122a of the seismic truck 106a of FIG. 1A. The wireline tool 106c may also provide data to the surface unit 134. The surface unit 134 collects data generated during the wireline operation and produces data output 135 which may be stored or transmitted. The wireline tool 106c may be positioned at various depths in the wellbore to provide a survey or other information relating to the subterranean formation.

Sensors S, such as gauges, may be positioned about the oilfield to collect data relating to various oilfield operations as described previously. As shown, a sensor S may be positioned in the wireline tool 106c to measure downhole parameters which relate to, for example porosity, permeability, fluid composition and/or other parameters of the oilfield operation.

Figure 1D:
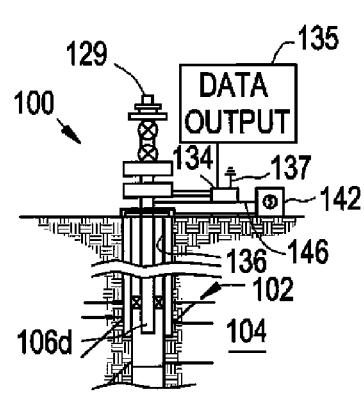
FIG. 1D depicts a simplified, schematic view of an oilfield operation having subterranean formations containing reservoirs and a production operation being performed by a production tool deployed from a production unit into a completed wellbore for drawing fluid from the reservoirs into surface facilities.

FIG. 1D depicts a production operation being performed by a production tool 106d deployed from a production unit or Christmas tree 129 and into the completed wellbore 136 of FIG. 1C for drawing fluid from the downhole reservoirs into surface facilities 142. Fluid flows from reservoir 104 through perforations in the casing (not shown) and into the production tool 106d in the wellbore 136 and to the surface facilities 142 via a gathering network 146.

Sensors S, such as gauges, may be positioned about the oilfield to collect data relating to various oilfield operations as described previously. As shown, a sensor S may be positioned in the production tool 106d or associated equipment, such as the Christmas tree, gathering network, surface facilities and/or a production facility, to measure fluid parameters, such as fluid composition, flow rates, pressures, temperatures, and/or other parameters of the production operation.

While only simplified wellsite configurations are shown, it will be appreciated that the oilfield may cover a portion of land, sea and/or water locations that hosts one or more wellsites. Production may also include injection wells (not shown) for added recovery. One or more gathering facilities may be operatively connected to one or more of the wellsites for selectively collecting downhole fluids from the wellsite(s).

While FIGS. 1B-1D depict tools used to measure properties of an oilfield, it will be appreciated that the tools may be used in connection with non-oilfield operations, such as mines, aquifers, storage or other subterranean facilities. Also, while certain data acquisition tools are depicted, it will be appreciated that various measurement tools capable of sensing parameters, such as seismic two-way travel time, density, resistivity, production rate, etc., of the subterranean formation and/or its geological formations may be used. Various sensors S may be located at various positions along the wellbore and/or the monitoring tools to collect and/or monitor the desired data. Other sources of data may also be provided from offsite locations.

The oilfield configurations of FIGS. 1A-1D are intended to provide a brief description of an example of an oilfield usable with the present invention. Part, or all, of the oilfield may be on land, water and/or sea. Also, while a single oilfield measured at a single location is depicted, the present invention may be utilized with any combination of one or more oilfields, one or more processing facilities and one or more wellsites.

Figure 2A:
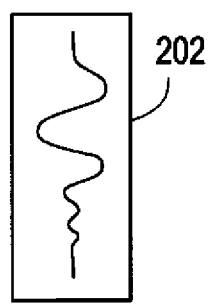
FIG. 2A depicts a seismic trace of the subterranean formation of FIG. 1A.
Figure 2B:
FIG. 2B depicts a core test result of the core sample of FIG. 1B.
Figure 2C:
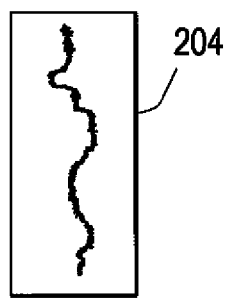
FIG. 2C depicts a well log of the subterranean formation of FIG. 1C.
Figure 2D:
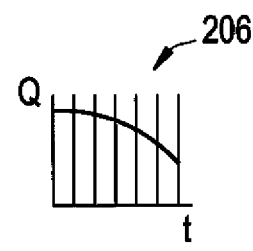
FIG. 2D depicts a production decline curve of fluid flowing through the subterranean formation of FIG. 1D.

FIGS. 2A-2D are graphical depictions of examples of data collected by the tools of FIGS. 1A-1D, respectively. FIG. 2A depicts a seismic trace 202 of the subterranean formation of FIG. 1A taken by seismic truck 106a. The seismic trace may be used to provide data, such as a two-way response over a period of time. FIG. 2B depicts a core sample 133 taken by the drilling tools 106b. The core sample may be used to provide data, such as a graph of the density, porosity, permeability or other physical property of the core sample over the length of the core. Tests for density and viscosity may be performed on the fluids in the core at varying pressures and temperatures. FIG. 2C depicts a well log 204 of the subterranean formation of FIG. 1C taken by the wireline tool 106c. The wireline log 204 may provide a resistivity or other measurement of the formation at various depths. FIG. 2D depicts a production decline curve or graph 206 of fluid flowing through the subterranean formation of FIG. 1D measured at the surface facilities 142. The production decline curve typically provides the production rate Q as a function of time t.

The respective graphs of FIGS. 2A-2C depict examples of static measurements that may describe or provide information about the physical characteristics of the formation and reservoirs contained therein. These measurements may be analyzed to better define the properties of the formation(s) and/or determine the accuracy of the measurements and/or for checking for errors. The plots of each of the respective measurements may be aligned and scaled for comparison and verification of the properties.

FIG. 2D depicts an example of a dynamic measurement of the fluid properties through the wellbore. As the fluid flows through the wellbore, measurements are taken of fluid properties, such as flow rates, pressures, composition, etc. As described below, the static and dynamic measurements may be analyzed and used to generate models of the subterranean formation to determine characteristics thereof. Similar measurements may also be used to measure changes in formation aspects over time.

Figure 3:
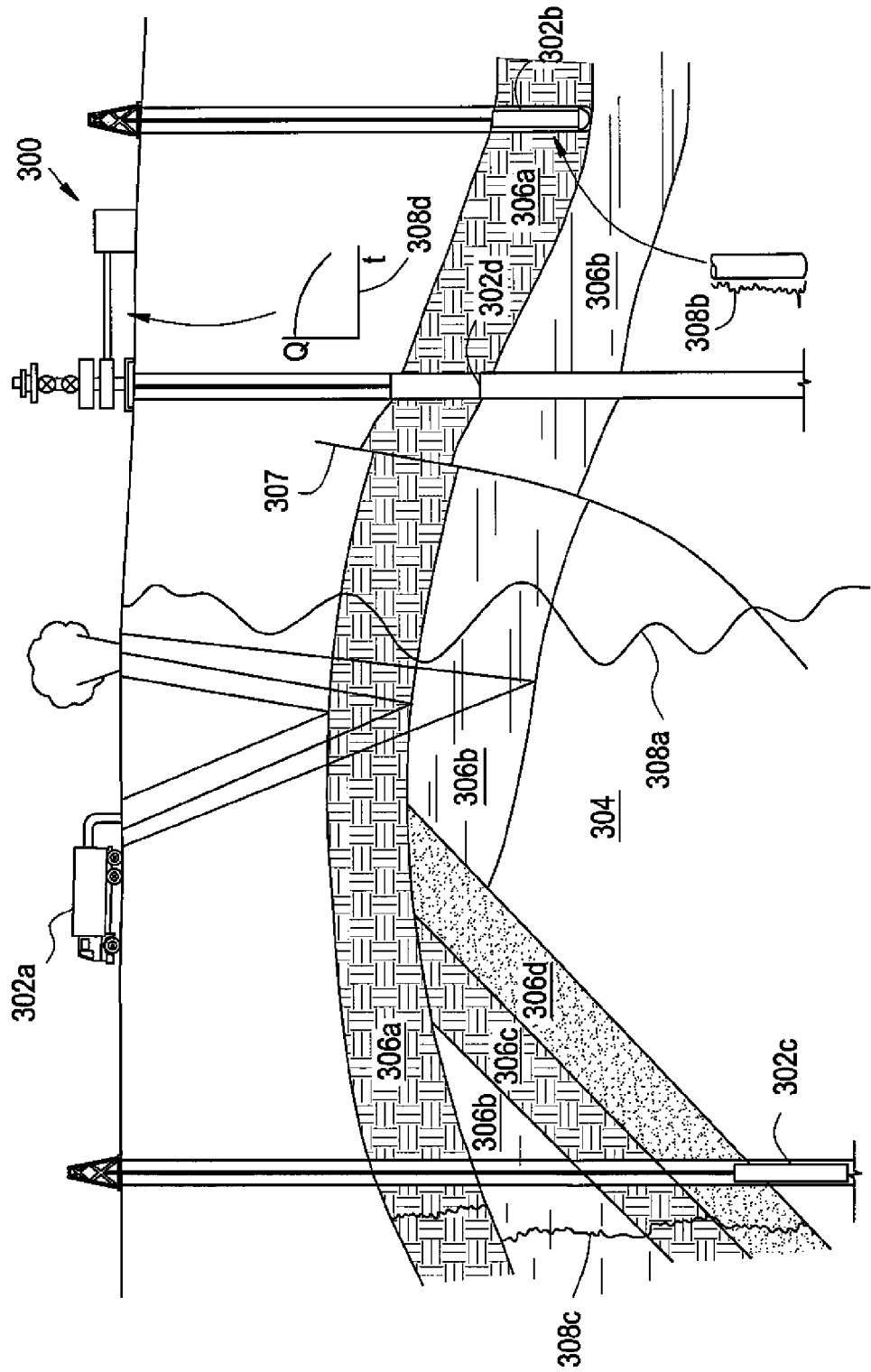
FIG. 3 is a schematic view, partially in cross-section, of an oilfield having a plurality of data acquisition tools positioned at various locations along the oilfield for collecting data from the subterranean formation.

FIG. 3 is a schematic view, partially in cross section of an oilfield 300 having data acquisition tools 302a, 302b, 302c and 302d positioned at various locations along the oilfield for collecting data of the subterranean formation 304. The data acquisition tools 302a-d may be the same as data acquisition tools 106a-d of FIGS. 1A-D, respectively, or others not depicted. As shown, the data acquisition tools 302a-d generate data plots or measurements 308a-d, respectively. These data plots are depicted along the oilfield to demonstrate the data generated by the various operations.

Data plots 308a-c are examples of static data plots that may be generated by the data acquisition tools 302a-d, respectively. Static data plot 308a is a seismic two-way response time and may be the same as the seismic trace 202 of FIG. 2A. Static plot 308b is core sample data measured from a core sample of the formation 304, similar to core sample 133 of FIG. 2B. Static data plot 308c is a logging trace, similar to the well log 204 of FIG. 2C. Production decline curve or graph 308d is a dynamic data plot of the fluid flow rate over time, similar to the graph 206 of FIG. 2D. Other data may also be collected, such as historical data, user inputs, economic information and/or other measurement data and other parameters of interest.

The subterranean structure 304 has a plurality of geological formations 306a-d. As shown, the subterranean structure has several formations or layers, including a shale layer 306a, a carbonate layer 306b, a shale layer 306c and a sand layer 306d. A fault 307 extends through the layers 306a, 306b. The static data acquisition tools are preferably adapted to take measurements and detect characteristics of the formations.

While a specific subterranean formation with specific geological structures is depicted, it will be appreciated that the oilfield may contain a variety of geological structures and/or formations, sometimes having extreme complexity. In some locations, typically below the water line, fluid may occupy pore spaces of the formations. Each of the measurement devices may be used to measure properties of the formations and/or its geological features. While each acquisition tool is shown as being in specific locations in the oilfield, it will be appreciated that one or more types of measurement may be taken at one or more location across one or more oilfields or other locations for comparison and/or analysis.

The data collected from various sources, such as the data acquisition tools of FIG. 3, may then be processed and/or evaluated. Typically, seismic data displayed in the static data plot 308a from the data acquisition tool 302a may be used by a geophysicist to determine characteristics of the subterranean formations and features. Core data shown in static plot 308b and/or log data from the well log 308c are typically used by a geologist to determine various characteristics of the subterranean formation. Production data from the graph 308d is typically used by the reservoir engineer to determine fluid flow reservoir characteristics. The data analyzed by the geologist, geophysicist and the reservoir engineer may be analyzed using modeling techniques. Examples of modeling techniques are described in U.S. Pat. No. 5,992,519, WO2004049216, WO1999/064896, U.S. Pat. No. 6,313,837, US2003/0216897, U.S. Pat. No. 7,248,259, US20050149307 and US2006/0197759. Systems for performing such modeling techniques are described, for example, in issued U.S. Pat. No. 7,248,259, the entire contents of which is hereby incorporated by reference.

Figure 4:
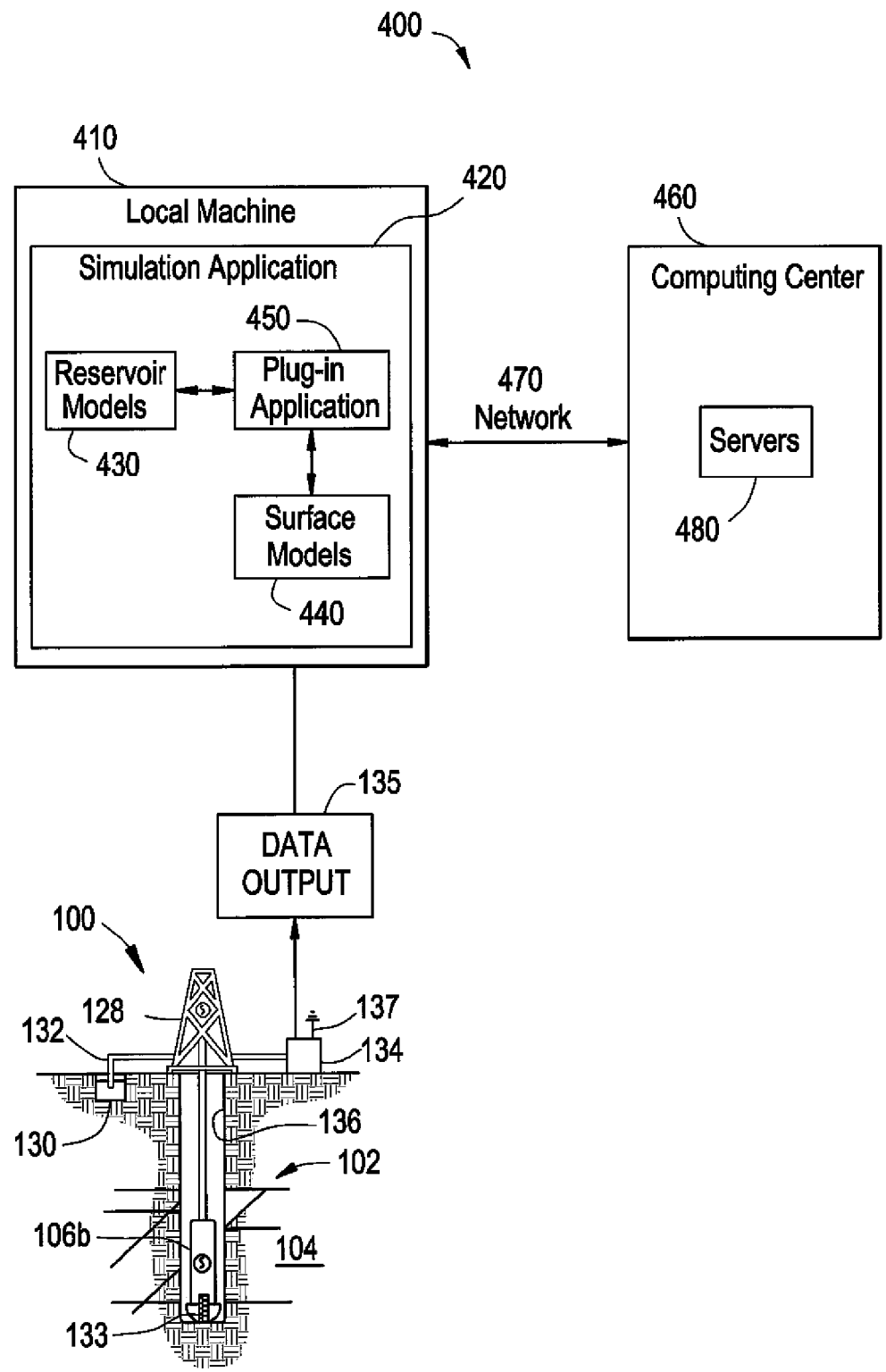
FIG. 4 depicts a schematic diagram of a simulation system in which the various technologies described herein may be incorporated and practiced.

FIG. 4 depicts a schematic diagram of a simulation system 400 in which various technologies described herein may be incorporated and practiced. The simulation system 400 may include a local machine 410 with which a user, such as a production engineer and/or the like, may interact. Typically, the local machine 410 may be located remotely from a computing center 460, such as at the desk of the user or in an office space. The local machine 410 may also include a simulation application 420 to create and simulate reservoir models 430 and surface models 440. In one implementation, the simulation application 420 may be PETREL™ by SCHLUMBERGER™ and may be used to create reservoir models 430. Typically, the reservoir models 430 may be simulated in ECLIPSE™ by SCHLUMBERGER™, and the surface models 440 may be created in PIPESIM™ by SCHLUMBERGER™.

The simulation application 420 may include a plug-in application 450. The plug-in application 450 may be configured to couple one or more multiple reservoir models 430 to one or more multiple surface models 440. Each coupled reservoir model 430 and surface model 440 may be referred to as a coupled model or a production scenario, which is more fully described with reference to FIG. 5. The plug-in application 450 may send the coupled models to a computing center 460 to be simulated. In one implementation, the coupled models may be simulated in the computing center 460 using the AVOCET Integrated Asset Management (IAM)™ software environment by SCHLUMBERGER™.

The plug-in application 450 may include program instructions for performing various techniques described herein and will be described in more detail in the paragraphs below. The program instructions may be written in a computer programming language such as C# and the like. The plug-in application 450 may be stored in memory, which may be any computer-readable media and may include volatile, non-volatile, removable, and non-removable media implemented in any method or technology for storage of information, such as computer-readable instructions, data structures, program modules or other data. Computer storage media may further include. RAM, ROM, erasable programmable read-only memory (EEPROM), flash memory or other solid state memory technology, CD-ROM, digital versatile disks (DVD), or other optical storage, magnetic cassettes, magnetic tape, magnetic disk storage or other magnetic storage devices, or any other medium which can be used to store the desired information and which can be accessed by the processor. Communication media may embody computer readable instructions, data structures and program modules. By way of example, communication media may include wired media such as a wired network or direct-wired connection, and wireless media such as acoustic, RF, infrared and other wireless media. Combinations of any of the above may also be included within the scope of computer readable media.

The computing center 460 may be located at/near the oilfield or remote from the oilfield. In addition, the computing center may also be remote from the local machine 410 and may include a plurality of servers 480 and other computing resources. As such, the computing center 460 may have the resources necessary to execute numerous simulations associated with the reservoir models 430 and surface models 440. In one implementation, the servers 480 in the computing center 460 may be configured with a Linux operating system. However, in other embodiments, other operating systems, such as Windows or Unix-based operating systems may be used. Further, the computing center 460 may be in communication with the surface unit 134, described in FIGS. 1B-1D.

The computing center 460 may be in communication with the local machine 410 through network 470. The network 470 may be any type of network including, but not limited to, a wireless network, a local area network (LAN), or a wide area network (WAN). Furthermore, the computing center 460 may include multiple servers 480 and other computing resources to execute the simulations of all the coupled models sent by the local machine 410. Once all the coupled models have been simulated, the computing center 460 may return the results back to the local machine 410. In one implementation, the results or output of the simulations may be in the form of a production forecast. As used herein, a production forecast may represent an estimation of the amount of fluid (e.g., oil, gas, water) that can be recovered from a reservoir over time according to the parameters set forth by the reservoir models 430 and surface models 440. As such, the production forecast may be displayed in the form of textual information or pictorially, such as in the form of graphs, histograms, and the like.

Figure 5:
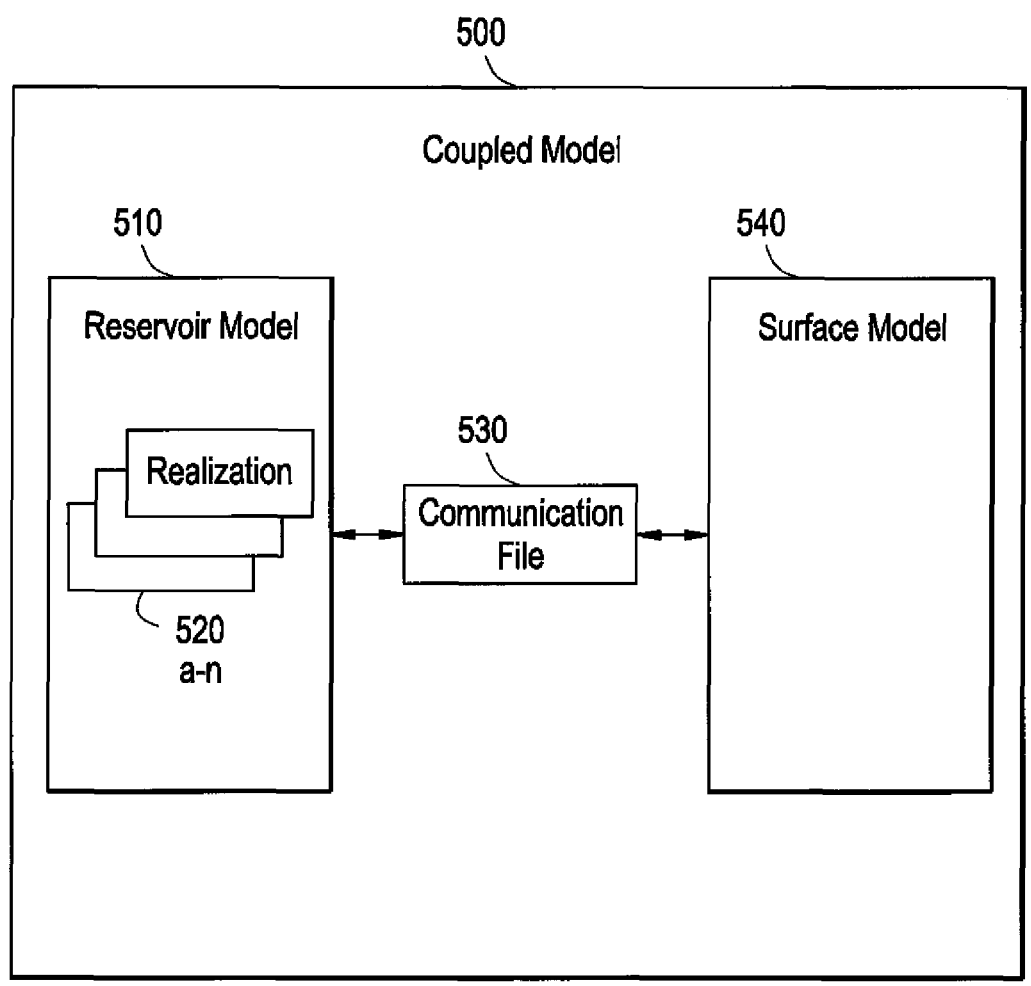
FIG. 5 depicts a schematic diagram of a coupled model in which the various technologies described herein may be incorporated and practiced.

FIG. 5 depicts a schematic diagram of a coupled model 500 in which the various technologies described herein may be incorporated and practiced. As previously mentioned, the coupled model 500 may in some instances be referred to as a production scenario. The coupled model 500 may include a reservoir model 510 in communication with a surface model 540 through a communication file 530. While FIG. 5 illustrates the coupled model 500 having one reservoir model 510, it should be understood that multiple reservoir models are also possible in other implementations.

The reservoir model 510 may be used to measure certain aspects of a particular reservoir. As such, the reservoir model 510 may model the interactions of various fluids within the reservoir such as oil, natural gas, water, and the like. In one implementation, the reservoir model 510 may be a file composed of various uncertainty variables including, but not limited to, porosity, permeability, pressure, and temperature. To this end, the reservoir model 510 may include multiple realizations 520*a-n*, each having different values filled in for the uncertainty variables to account for different scenarios in the reservoir. Additionally, the reservoir model 510 may be a subset of the reservoir models 430 from FIG. 4.

The surface model 540 may model various surface and/or production facilities used to measure, access, or otherwise manage the fluids in the reservoir. For example, the surface model 540 may account for a particular configuration of pipelines, well heads, well bores, etc. Additionally, the surface model 540 may be a subset of the surface models 440 from FIG. 4.

The communication file 530 may be generated by the plug-in application 450 in order to facilitate communication between the reservoir model 510 and the surface model 440. As such, the communication file 530 may be configured to manage and balance the coupled model 500 by taking into account the restrictions set forth by the parameters of the reservoir model 510 and surface model 540. As previously mentioned, the output of a simulation executed on the coupled model 500 may be in the form of a production forecast. The production forecast may estimate the amount of fluid recoverable from a reservoir at different points in time i.e., timesteps. To this end, the communication file 530 may enable the simulation to account for characteristics in both the reservoir model 510 and the surface model 540 at every timestep.

For instance, different properties in a reservoir, such as the pressure, volume, and temperature of a fluid, may affect the amount of recoverable fluid. Such characteristics may be modeled by the reservoir model 510. Moreover, different surface network facilities, modeled by the surface model 440, can also affect the amount of recoverable fluid. Therefore, the communication file 530 may allow such properties from both the reservoir model 510 and the surface model 540 to be taken into account in one coupled model 500. For example, the communication file 530 may define the type of fluids to be simulated in the coupled model. Additionally, the communication file 530 may be capable of associating fluids in the reservoir model 510 with different elements of the surface model 540, such as pipelines, wellbores, and the like. As a result, the entire production process may be simulated as a whole, taking into account the realizations 520*a-n* of the reservoir model 510 coupled with the surface model 540. In one implementation, the communication file 530 may be implemented as a reservoir-to-surface-link (R2SL) file or an R2SL*.DATA file as part of the AVOCET Integrated Asset Management (IAM) software.

FIG. 6 illustrates a flow diagram of a method for automatically coupling reservoir models 430 with surface models 440 in accordance with one or more implementations of various techniques described herein.

In step 610, the plug-in application 450 may receive the location of a file directory containing the reservoir models. For example, the plug-in may prompt a user to enter a file path to the file directory having the reservoir models 430. In one implementation, the plug-in may be added into a PETREL™ by SCHLUMBERGER software environment. As such, the file directory with the reservoir models 430 may be referred to as the PETREL™ simulation folder, and the reservoir models 430 may be referred to as simulation cases.

In step 620, the plug-in application 450 may receive a reservoir model 510 to be coupled to a surface model 540 and simulated. In one implementation, the reservoir model 510 may be identified by a suffix supplied by the user. The suffix may be present in the file name of the reservoir model and may simply be a string of characters. As such, the plug-in application 450 may prompt a user to enter a suffix to identify the desired reservoir model 510. Other means of identifying a reservoir model 510 to be coupled and simulated may also be possible. For example, in a scenario using an AVOCET IAM communication file 530, after a user enters the suffix into the plug-in application 450, the plug-in application may search for reservoir models having "IAM" and the suffix present in their names.

In step 630, the plug-in application 450 may receive a surface model 540 that will be used to couple and simulate with a reservoir model. In one implementation, the plug-in application 450 may prompt a user to enter the file path to a file directory containing the surface model 540. With the correct file path, the plug-in application 450 may then be able to access the surface model 540 and associate it with the reservoir model 510.

In step 640, a determination may be made as to whether all reservoir models to be simulated have been identified. In one implementation, whether all reservoir models have been identified may depend on whether a user has finished entering all the suffixes associated with the desired reservoir models. Once the user has finished, the plug-in application 450 may receive an indication from the user that all desired reservoir models 510 have been identified. If not all reservoir models have been identified (e.g., the user has not indicated as such), the method 600 may begin again in step 620. As such, plug-in application 450 may then continue identifying another reservoir model to be simulated based on another suffix inputted by the user. Then, as explained previously with reference to step 630, the plug-in application 450 may receive a surface model to be coupled with the reservoir model. In another implementation, the plug-in application may receive two or more reservoir models 510 and two or more surface models 540. As such, steps 630 though 640 may be performed at least twice. If all reservoir models to be simulated have been identified, the method 600 may proceed onto step 650.

In step 650, the plug-in application 450 may automatically generate a communication file 530 to couple each identified reservoir model 510 to its associated surface model 540. In other words, a separate communication file 530 may be generated for each coupled model 500. In one implementation, the communication file 530 may be generated from a communication file template received by the plug-in application 450 from a user. As such, the communication file template may define the general layout for coupling a reservoir model 510 and a surface model 540. For example, the communication file template may include default values for certain variables and/or parameters that need to be modified or filled in order to couple a specific reservoir model 510 with a surface model 540. To this end, the plug-in application 450, in order to generate the communication file 530, may modify the communication file template by automatically filling in such variables and parameters to match information associated with the reservoir model 510 and surface model 540. For example, the plug-in application 450 may write the correct file paths to the file directories having the reservoir model 510 and the surface model 540 into the communication file 530. This is because the communication file template may contain the incorrect information. Furthermore, as illustrated in FIG. 5, multiple realizations 520a-n of the reservoir model 510 may be coupled to the surface model 540 through the communication file 530.

In step 660, after all reservoir models and surface models have been coupled, the plug-in application 450 may automatically send these coupled models to the computing center 460 to be simulated. When the simulations have been completed, the computing center 460 may then send the results, i.e., the production forecasts, for each coupled model 500 back to the local machine 410 where the plug-in application 450 may be stored. The results may then be displayed to the user on the local machine 410.

Thus, various technologies described herein may have the advantage of automatically performing multiple simulations of coupled models 500. This may be in contrast to conventional methods of simulated coupled models. Typically, a user would be required to manually create a communication file 530 for each reservoir model 510 and surface model 540 in order to create a coupled model 500. Then, the user would be required to send the newly created coupled model 300 to the computing center 460 to be simulated. Thus, each coupled model 500 may have to be created and simulated one at a time. In the context of numerous coupled models, such a process may prove tedious and inefficient.

The various technologies described herein may provide a plug-in application 450 to automatically generate communication files 530 for multiple coupled models 500. To accomplish this task, a user may simply provide a few inputs, such as the location or file path of the reservoir models 430 and surface models 440. In some implementations, the user may also provide a communication file template. Using such inputs, the plug-in application can automatically generate all the desired coupled models 500 and send the coupled models 500 together at once to a computing center 460 to be simulated. Thus, the various technologies described herein provide a relatively efficient way to simulate oilfield operations having a relatively large amount of coupled reservoir models and surface models.

This description is intended for purposes of illustration only and should not be construed in a limiting sense. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The scope of this invention should be determined only by the language of the claims that follow. The term "comprising" within the claims is intended to mean "including at least" such that the recited listing of elements in a claim are an open group. "A," "an" and other singular terms are intended to include the plural forms thereof unless specifically excluded.

What is claimed is:

1. A method for simulating oilfield operations, comprising:
   receiving two or more reservoir models to be simulated;
   receiving two or more surface models to be simulated;
   automatically generating a communication file to couple the two or more reservoir models with the two or more surface models, wherein automatically generating the communication file comprises:
      receiving a communication file template; and
      modifying information in the communication file template to correspond to variables and parameters of the reservoir models and the surface models; and
   automatically simulating the coupled reservoir models and surface models using the communication file such that the communication file manages and balances the coupled reservoir models and surface models by taking into account one or more restrictions set forth by one or more parameters of the reservoir models and the surface models.

2. The method of claim 1, wherein the two or more reservoir models are selected from a file directory having a plurality of reservoir models, and wherein automatically generating the communication file includes writing into the communication file a file path for the file directory.

3. The method of claim 2, wherein receiving the two or more reservoir models comprises:
   receiving a suffix associated with each reservoir model listed on the file directory; and
   selecting each reservoir model based on the suffix.

4. The method of claim 3, wherein the suffix is a string of characters present in a file name of the reservoir model.

5. The method of claim 1, wherein the two or more surface models are selected from a file directory having a plurality of surface models, and wherein automatically generating the communication file includes writing into the communication file a file path for the file directory.

6. The method of claim 1, wherein automatically generating the communication file comprises generating a different communication file for each coupled reservoir model and surface model, and wherein automatically simulating the coupled reservoir models and surface models uses the different communication file for each coupled reservoir model and surface model.

7. The method of claim 1, wherein automatically generating the communication file comprises:
   receiving the communication file template from a user.

8. The method of claim 1, wherein automatically simulating the coupled reservoir models and surface models comprises:
  sending the communication file, the coupled reservoir models and surface models to a computing center for use in simulating the coupled reservoir models and surface models; and
  receiving a simulation for each coupled reservoir model and surface model.

9. The method of claim 8, wherein each simulation is a production forecast that estimates an amount of fluid recoverable over time from a reservoir represented by a coupled reservoir model and surface model.

10. The method of claim 1, wherein the communication file is a reservoir-to-surface-link (R2SL) file.

11. The method of claim 1, the communication file is configured to associate fluids in the reservoir models with different elements of the surface models.

12. A simulation system, comprising:
  at least one processor; and
  a memory comprising program instructions that when executed by the at least one processor, cause the at least one processor to:
    receive two or more reservoir models to be simulated;
    receive two or more surface models to be simulated;
    automatically generate a communication file to couple the two or more reservoir models with the two or more surface models, wherein the program instructions configured to automatically generate the communication file comprises program instructions configured to:
      receive a communication file template; and
      modify information in the communication file template to correspond to variables and parameters of the reservoir models and the surface models; and
    automatically simulate the coupled reservoir models and surface models using the communication file such that the communication file manages and balances the coupled reservoir models and surface models by taking into account one or more restrictions set forth by one or more parameters of the reservoir models and the surface models.

13. The system of claim 12, wherein the two or more reservoir models are selected from a file directory having a plurality of reservoir models, and wherein automatic generation of the communication file includes writing into the communication file a file path for the file directory.

14. The system of claim 13, wherein the program instructions configured to receive the two or more reservoir models comprise program instructions configured to:
  receive a suffix associated with each reservoir model listed on the file directory; and
  select each reservoir model based on the suffix.

15. The system of claim 12, wherein the program instructions configured to automatically generate the communication file comprises program instructions configured to:
  receive the communication file template from a user.

16. A non-transitory computer readable medium having stored thereon computer-executable instructions which, when executed by a computer, cause the computer to:
  receive two or more reservoir models to be simulated;
  receive two or more surface models to be simulated;
    automatically generate a communication file to couple the two or more reservoir models with the two or more surface models, wherein the program instructions configured to automatically generate the communication file comprises program instructions configured to:
      receive a communication file template; and
      modify information in the communication file template to correspond to variables and parameters of the reservoir models and the surface models; and
    automatically simulate the coupled reservoir models and surface models using the communication file such that the communication file manages and balances the coupled reservoir models and surface models by taking into account one or more restrictions set forth by one or more parameters of the reservoir models and the surface models.

* * * * *